US006620714B2

(12) United States Patent
Su et al.

(10) Patent No.: US 6,620,714 B2
(45) Date of Patent: Sep. 16, 2003

(54) METHOD FOR REDUCING OXIDATION ENCROACHMENT OF STACKED GATE LAYER

(75) Inventors: Chun-Lien Su, Tainan Hsien (TW); Chun-Chi Wang, Nantou (TW); Ming-Shang Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/043,147

(22) Filed: Jan. 14, 2002

(65) Prior Publication Data

US 2003/0134461 A1 Jul. 17, 2003

(51) Int. Cl.[7] .................. H01L 21/3205; H01L 21/4763

(52) U.S. Cl. ....................... 438/585; 438/514; 438/595; 438/635; 438/770; 438/786; 438/787; 438/791

(58) Field of Search ................................ 438/769, 770, 438/775, 778, 787, 786, 791, 514, 517, 522, 585, 595, 635

(56) References Cited

U.S. PATENT DOCUMENTS 6,090,653 A * 7/2000 Wu ............................ 438/231
6,200,870 B1 * 3/2001 Yeh et al. ................... 438/302
6,207,542 B1 * 3/2001 Ibok ........................... 438/585
6,232,187 B1 * 5/2001 Kuroi et al. ................ 438/287
6,323,106 B1 * 11/2001 Huang et al. ............... 438/433
6,383,939 B1 * 5/2002 Yang et al. ................. 438/706

* cited by examiner

*Primary Examiner*—Amir Zarabian
*Assistant Examiner*—Maria Guerrero

(57) ABSTRACT

A method for reducing oxidation encroachment of stacked gate layer is provided by forming a silicon oxynitride layer on the sidewall surface of the stacked gate layer. A tilted ion implantation step is performed to implant nitrogen ions into the sidewall surface of the stacked gate layer to rich nitrogen containing in the sidewall surface of the stacked gate layer. An oxygen-annealing step is subsequently performed to form a silicon oxynitride layer on the sidewall surface of the stacked gate layer. The silicon oxynitride layer can prevent the polysilicon layer in the stacked gate layer being continuously encroached from the oxygen.

7 Claims, 5 Drawing Sheets

200
θ
130
130
130
128a
126a
124a
122a
114a
112a
100
300
300
128a
126a
124a
122a
114a
112a
120
100

METHOD FOR REDUCING OXIDATION ENCROACHMENT OF STACKED GATE LAYER

FIELD OF THE INVENTION

The present invention relates to a method of fabricating a semiconductor memory device, and more particularly to a method for reducing oxidation encroachment of stacked gate layer.

BACKGROUND OF THE INVENTION

Memory technology has progressed considerably in recent years. Since the operational speed and the manipulation data amount of a central processing unit (CPU) is increasing, the performance of a memory cell is increasing at the same time. For example, high speed erasing is a popular method for improving the performance of a memory. Volatile storage memories, such as random access memories (RAM), are widely used in computer nowadays. However, the stored data in RAM vanishes while the power is broke off. Another nonvolatile storage memories, such as mask read only memory (Mask ROM), erasable programmable ROM (EPROM), or electrically erasable programmable ROM (EEPROM) will not lost the stored messages when power dismissed and will be better for some specific usage.

Flash memories are also a nonvolatile storage memory, which has similar structure than conventional EEPROMs. They have a very high erasing speed feature in either an overall region or a local region thereof, and therefore they are very popularly applied in the computer field. For example, they are used to replace the read-only memories to store the firmware such as BIOS (basic input/output system). The users can easily update their BIOS by rewriting the flash memory.

Conventional flash memory cells have a double or triple layer of polysilicon structure. The first polysilicon layer is patterned to form the floating gates, and the second polysilicon layer is patterned to form the control gates and the word lines structure. A third polysilicon layer is patterned as select gates to form the triple layer polysilicon structure.

In the process of fabricating flash memory cells, the first polysilicon layer is patterned by photolithography and etching technology to form a plurality of parallel lines. The second polysilicon layer is subsequently formed and patterned to form a plurality of parallel lines that served as the control gates and the structure of the word lines which is perpendicular to the first polysilicon lines. While forming the control gates, the portion of underlying first polysilicon lines between two word lines is also removed until exposing the substrate to form the floating gates. However, in the procedure of etching the first polysilicon lines, since the anisotropic etching limitation, the removed portion of the first polysilicon lines is not completed and portion of the polysilicon is remained on the sidewall of the insulating layer. This results in circuit short between word lines because of the polysilicon residue connection, and therefore data can not be access to the memory. In order to eliminating polysilicon residue, a conventional method is achieved by thermal oxidization treatment to convert polysilicon residue into silicon dioxide. Although the polysilicon residue can be eliminated, exposed edge portions of the first and second polysilicon layers are also encroached in the long time thermal oxidation treatment process, so that the thickness of the edge portion of ONO layer between the first and second polysilicon layers are increased. The increased thickness of the ONO layer reduces the capacitance coupling ratio between the control gate and floating gate, electron trapping capability of the floating gate is decreased and thereby affecting the operation performance of the flash memory.

SUMMARY OF THE INVENTION

The present invention provides a method for reducing oxidation encroachment of stacked gate layer by implanting nitrogen ions into sidewall surface of the stacked gate layer to reduce the oxidation rate to the stacked gate layer. The present invention also provides enough time to eliminate polysilicon residue under less oxidation encroachment of the stacked gate layer, and increases process window of oxidation process.

The present invention provides a method for reducing oxidation encroachment of stacked gate layer. The method comprises the following steps. A titled ion implantation step is performed to implant nitrogen ions into the sidewall surface of the polysilicon layer. An oxygen-annealing step is then performed to form a silicon oxynitride layer on the sidewall of the polysilicon layer.

The present invention also provides a method of fabricating a semiconductor memory device. The method at least comprises the following steps. A gate oxide layer, a first polysilicon layer and a nitride layer are formed on a semiconductor substrate, and the nitride layer, the first polysilicon layer and the gate oxide layer are then patterned to form desired pattern. An insulating layer is formed over the semiconductor substrate. A portion of the insulating layer is removed until exposing the nitride layer, and the nitride layer is subsequently removed. A second polysilicon layer is formed on the first polysilicon layer and adjacent portion of the insulating layer. A dielectric layer, a third polysilicon layer and a conductive layer are formed over the semiconductor substrate. The conductive layer, the third polysilicon layer, the dielectric layer, the second polysilicon layer and the first polysilicon layer to form a plurality of parallel stacked gate layers. A tilted ion implantation step is performed to implant nitrogen ions into the sidewall surface of the stacked gate layers. An oxygen-annealing step is then performed to form a silicon oxynitride layer on the sidewall surface of the stacked gate layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method for reducing oxidation encroachment of stacked gate layer. Nitrogen ions are implanted into the sidewall surface of the stacked gate layer so that oxidation rate to the stacked gate layer can be reduced. Therefore, the process has enough time to remove polysilicon residue and the process window of thermal oxidation treatment can be increased.

Figure 1A:
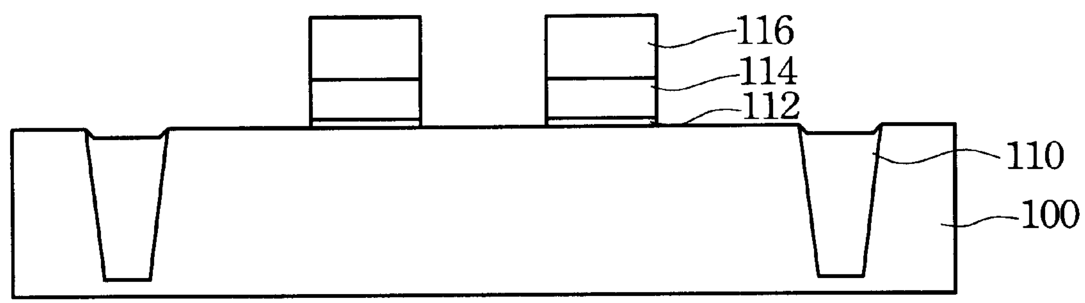
FIGS. 1A–1G are schematic cross-sectional views of one preferred embodiment of the present invention in X direction.

FIGS. 1A–1G are schematic, cross-sectional views of the preferred embodiment of the present invention in X direction. Referring to FIG. 1A, a semiconductor substrate 100 such as a p-type doped silicon substrate with <100> lattice structure. An isolating structure 110 is fabricated in the substrate 100 to layout the active regions for each memory cell. The isolating structure 110 can be a field oxide layer formed by LOCOS method, and preferably be a shallow trench isolation (STI) structure.

A gate oxide layer 112, a first polysilicon layer 114 and a nitride layer 116 are formed in sequence on the substrate 100. The gate oxide layer 112 can be formed by thermal oxidation technology with a thickness of about 30–150 angstroms. The first polysilicon layer 114 can be formed by low pressure chemical vapor deposition (LPCVD) at a temperature of about 600–650° C. with a thickness of about 500–1500 angstroms. The first polysilicon layer 114 also can be a doped polysilicon layer. The nitride layer 116 can be formed by CVD with a thickness of about 1100–2400 angstroms. The stacked layer that including the gate oxide layer 112, the first polysilicon layer 114 and the nitride layer 116 is then patterned by conventional photolithography and etching technology to define desired pattern. Undesired portions of the stacked layer are removed to form a plurality of first linear stacked layer, as shown in FIG. 1A.

Figure 1B:
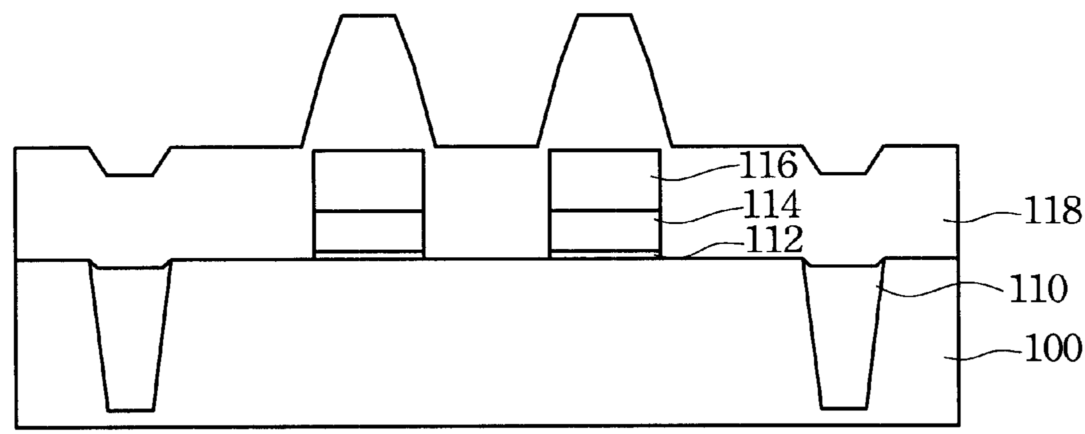
Figure 1:
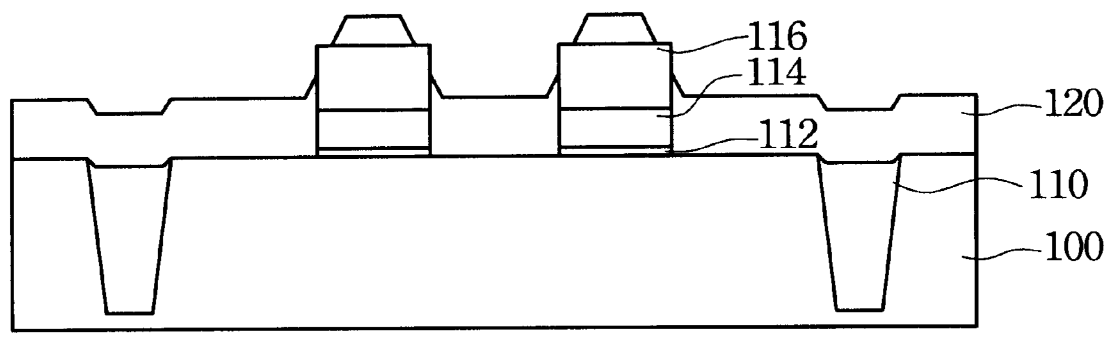
Figure 1:
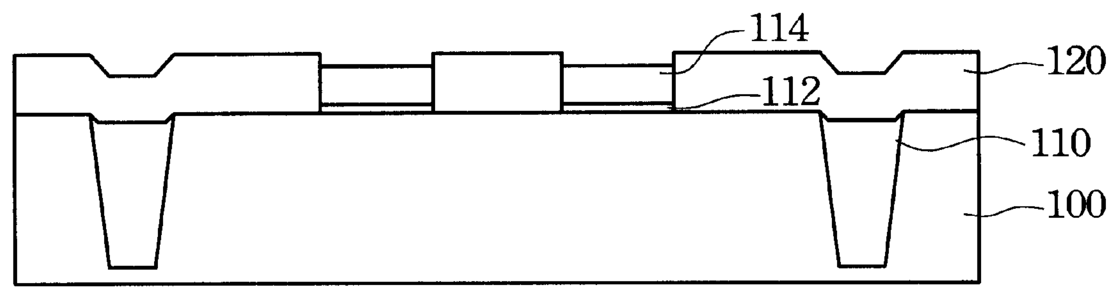

Referring to FIG. 1B, an insulating layer 118, such as an oxide layer, is formed over the substrate 100. The insulating layer 118 is preferably a HDP oxide layer with a thickness of about 1.5–3.5 kilo-angstroms formed by high density plasma chemical vapor deposition (HDP-CVD) of which mainly depositing in vertical direction to obtain a dense structure. Referring to FIG. 1C, portion of the insulating layer 118 is removed until remaining a desired thickness of the insulating layer 120. The resulting insulating layer 120 has a thickness little larger than the thickness of the first polysilicon layer 114, and can be a thickness of about 0.5–2 kilo-angstroms. The insulating layer 120 can be formed by wet dip etching with time control to obtain desired thickness. The insulating layer 120 also can be formed by reactive ion etching (RIE). The top corner of the nitride layer 116 is exposed when the insulating layer 120 is formed.

Figure 1E:
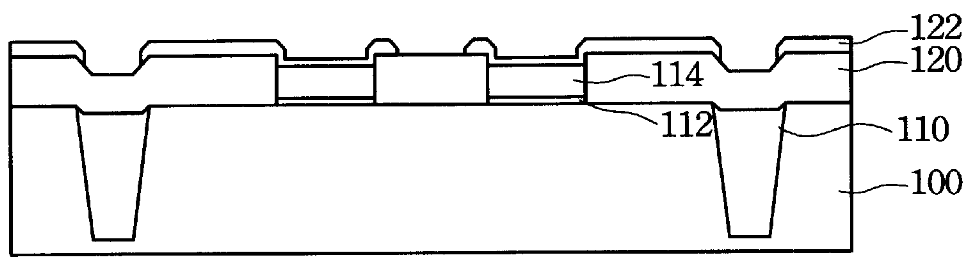

Referring to FIG. 1D, the nitride layer 116 and portion of the insulating layer thereon is removed by such as high selective wet etching to prevent damage on other exposed region. Referring to FIG. 1E, a second polysilicon layer 122 is formed on the first polysilicon layer 114 and the adjacent portion of the insulating layer 120. The second polysilicon layer 122 expands the area of the first polysilicon layer 114 and increases the coupling radio. The second polysilicon layer 122 can be formed with exemplary steps of depositing a polysilicon layer over the substrate 100 and then patterning the polysilicon by photolithography and etching technology to prevent electrically connection to adjacent portions of the first polysilicon layer 114.

Figure 1F:
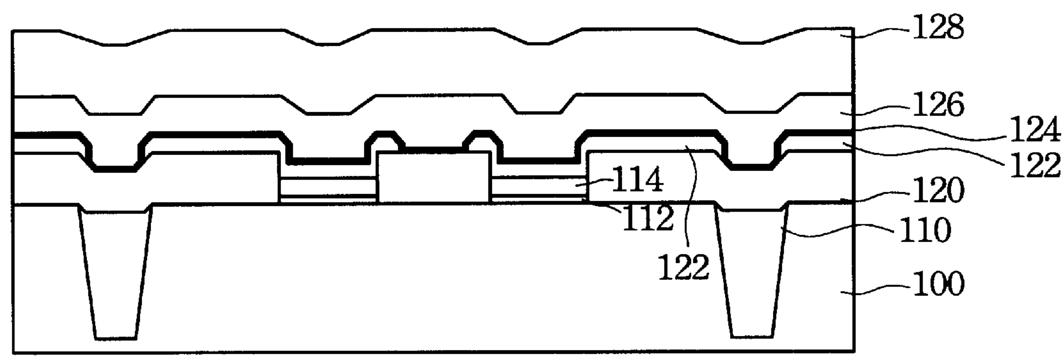

Referring to FIG. 1F, a dielectric layer 124, a third polysilicon layer 126 and a conductive layer 128 are formed in sequence over the substrate 100. The dielectric layer 124 is a layer located between the floating gate and control gate, and preferably an ONO layer of which stacked with an oxide layer, a nitride layer and an oxide layer. The dielectric layer 124 can has a thickness of about 50–250 angstroms. The third polysilicon layer 126 on the dielectric layer 124 can be formed by CVD. The conductive layer 128 is preferably made of a material of tungsten silicide ($WSi_x$), and can be formed by CVD.

Figure 1G:
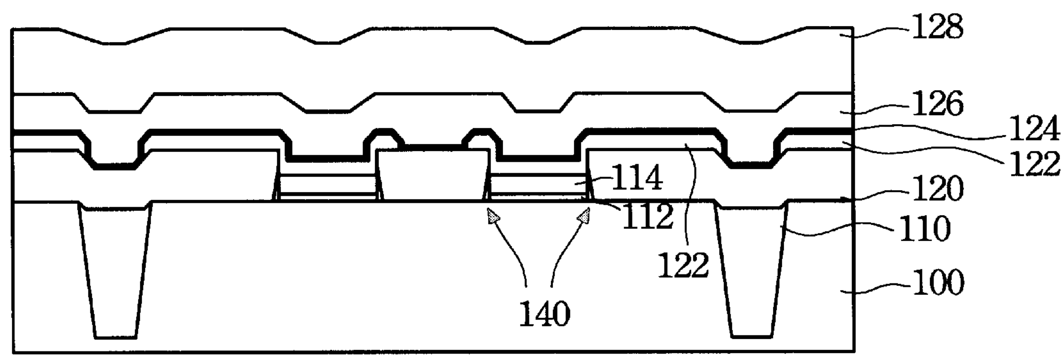

Referring to FIG. 1G, the stacked layer including the dielectric layer 124, the third polysilicon layer 126 and the conductive layer 128 is defined and patterned by conventional photolithography and etching technology to form a plurality of parallel second linear stacked layer that served as control gates, i.e. word lines. The second linear stacked layer is perpendicular to the first linear stacked layer having the first polysilicon layer 114. The above structure can be formed with following exemplary steps. A photoresist layer (not shown) is formed on the conductive layer 128, and then defined to get desired pattern by conventional photolithography technology. The underlying exposed portions of the conductive layer 128, third polysilicon layer 126, dielectric layer 124, second polysilicon layer 122, first polysilicon layer 114 and gate oxide layer are then etched in sequence with the patterned photoresist layer as a mask by anisotropic dry etching technology. For example, the anisotropic dry etching can use a reactive ion etching (RIE). The word lines having a conductive layer **128*a*, a third polysilicon layer 126*a*, a dielectric layer 124*a*, a second polysilicon layer 122*a*, a first polysilicon layer 114*a* and a gate oxide layer 112*a* are therefore formed. The patterned photoresist layer is then removed. The linear first polysilicon layer 114** is etched in above steps and only remains block regions under the word lines to serve as floating gates.

Figure 2:
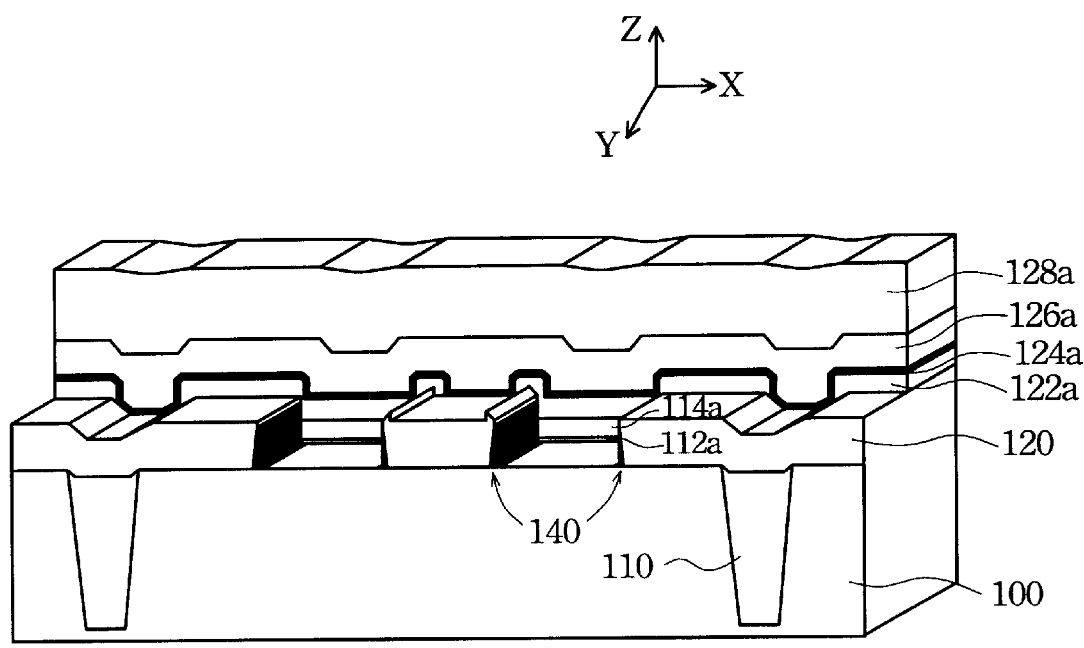
FIG. 2 is a schematic perspective view corresponding to FIG. 1G.

In the process of fabricating word lines, since the anisotropic dry etching is performed in a vertical direction, portions of the first polysilicon layer 114 are remained on the sidewall of the insulating layer 120, which is called a polysilicon residue. FIG. 2 is a schematic cross-sectional view corresponding to FIG. 1G. Referring to FIG. 2, during forming the first linear stacked layer, it is difficult to obtain rectangular top corner. The edge angle in top corner of the first linear stacked layer is about 85–88 degrees. Moreover, since the limitation of etching direction while forming the second linear stacked layer, the polysilicon residue 140 is easily remained on the sidewall. The polysilicon residue 140 will cause a circuit short between tow adjacent word lines and thus affect the operation of the memory.

Figure 3:
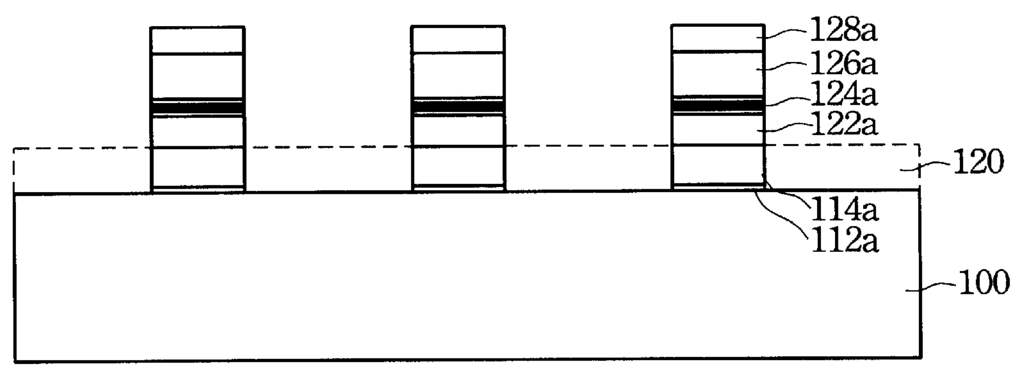
FIG. 3 is a schematic cross-sectional view of the present invention in Y direction corresponding to FIG. 1G.

FIG. 3 is a schematic cross-sectional view of the present invention in Y direction corresponding to FIG. 1G. Referring to FIGS. 1G, 2 and 3 simultaneously, the insulating layer 120 is located between two adjacent word line stacked gate layers, and the polysilicon residue 140 is attached on the sidewall of the insulating layer 120. In order to completely removing the polysilicon residue 140 that prevents operation error of the memory, a thermal oxidation treatment is utilized to fully convert the polysilicon residue 140 into silicon dioxide conventionally. Although the thermal oxidation treatment can completely remove the polysilicon residue 140, the long-time thermal oxidation treatment will result in oxidation encroachment to the word line stacked gate layers, especially in the sidewall portions of the second and third polysilicon layers **122*a* and 126*a* near the ONO layer 124*a*. The oxidized portions increase the thickness of the ONO layer 124*a*** in edge portion so that the capacitance coupling ratio of the control gate and floating gate is decreased, and the operation characteristic of the memory is therefore modified.

Figure 4A:
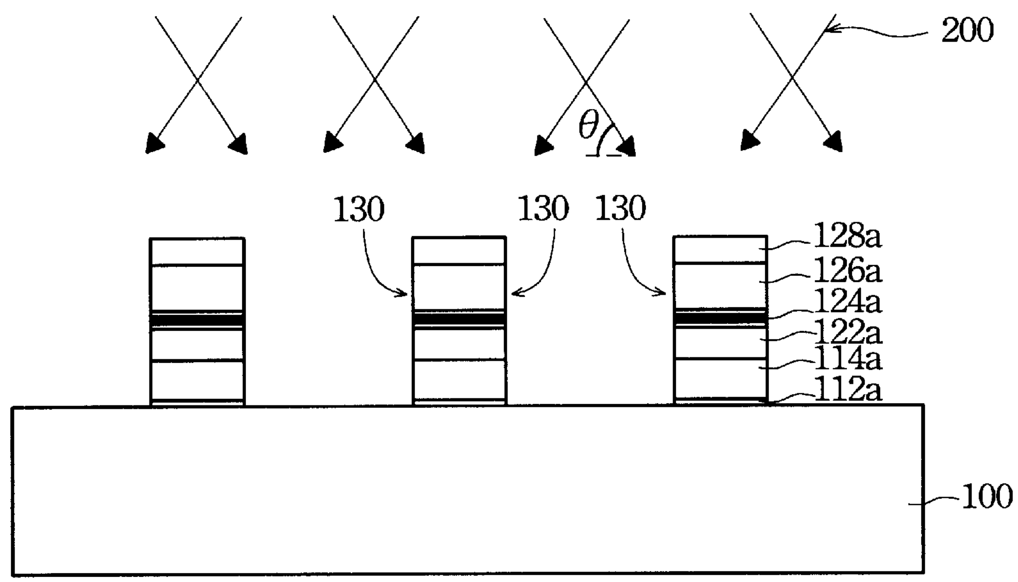
FIGS. 4A–4B are schematic cross-sectional views of the present invention in Y direction.
Figure 4B:
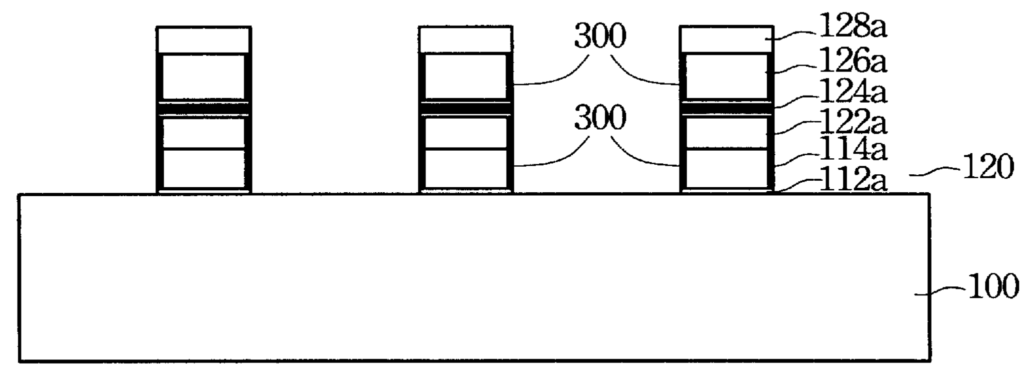

In order to prevent oxidation encroachment to the polysilicon layers **114*a*, 122*a* and 126*a* in the stacked gate layers, the present invention utilizes two processes to prevent oxidation encroachment occurring and remove the polysilicon residue 140. FIGS. 4A and 4B are schematic cross-sectional views of the preferred embodiment of the present invention in Y direction. Referring to FIG. 4A, a tilted ion implantation step 200 is performed to implant nitrogen ions into the sidewall surface 130 of the stacked gate layers that rich the nitrogen containing of the polysilicon layer 114***a*, 122*a* and 126*a*. In the tilted ion implantation step, the tilted angle θ, i.e. the angle between the implanting direction and the substrate surface, is at about 20–70 degrees, and preferably at about 50–65 degrees. The tilted angle θ is determined with the aspect radio of the opening between two adjacent word lines. The larger of the aspect radio of the opening so that the larger of the tilted angle θ.

Referring to FIG. 4B, an oxygen-annealing step is then performed after the tilted ion implantation step. Oxygen is induced into the reaction chamber of which reacts with the polysilicon residue 140 to convert the polysilicon residue 140 into silicon oxynitride (SiON). Since the sidewall surface 130 of the polysilicon layers 114*a*, 122*a*, and 126*a* in the stacked gate layers has been implanted with the nitrogen ions in the previous tilted ion implantation step, the silicon oxynitride layer is easily and shortly formed on the sidewall surface 130 of the polysilicon layers 114*a*, 122*a*, and 126*a*. The resulting silicon oxynitride layer inhibits the inside polysilicon continuously oxidized by the oxygen, so that the polysilicon layers 114*a*, 122*a* and 126*a* can be protected without oxidation encroachment under long time thermal oxidation treatment process. Hence, the process window of the thermal oxidation treatment process can be increased, and the process can be more stable.

In another hand, the nitrogen ions are also implanted into the polysilicon residue 140 in the tilted ion implantation step, and the nitrogen containing of the polysilicon residue 140 is therefore richened. The polysilicon residue 140 can be quickly reacted to being converted into the silicon oxynitride. The silicon oxynitride can be an insulating material because of having high resistivity greater than the polysilicon, so that the problem of electrically connection causing by the polysilicon residue 140 can be resolved. Moreover, the nitrogen ions is previously implanted into the polysilicon residue 140 before the oxygen-annealing step, the polysilicon residue 140 can be readily converted into insulating layer by using less heat energy, and the thermal budget can be therefore reduced.

According to above description, the method for reducing oxidation encroachment of stacked gate layer of the present invention can prevent the problem of thickness growth in the edge portion of the dielectric layer which caused by the oxidation encroachment. The method of the present invention also can completely remove the polysilicon residue on the sidewall of the insulating layer and provide stable process with low thermal budget. The present invention just provides a preferred embodiment to describe the method for reducing oxidation encroachment of stacked gate layer. However, the method also can be applied to other products, such as Mask ROM, or other similar products.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a semiconductor memory device, comprising the steps of:

forming a gate oxide layer, a first polysilicon layer and a nitride layer on a semiconductor substrate;

patterning the nitride layer, the first polysilicon layer and the gate oxide layer;

forming an insulating layer over the nitride layer;

removing portion of the insulating layer until exposing the nitride layer;

removing the nitride layer;

forming a second polysilicon layer on the first polysilicon layer and adjacent portion of the insulating layer;

forming a dielectric layer, a third polysilicon layer and a conductive layer sequentially over the second polysilicon layer;

patterning the conductive layer, the third polysilicon layer, the dielectric layer, the second polysilicon layer and the first polysilicon layer to form a plurality of parallel stacked gate layers;

performing a tilted ion implantation step to implant nitrogen ions into a sidewall surface of the stacked gate layers; and performing an oxygen-annealing step to form a silicon oxynitride layer on the sidewall surface of the stacked gate layers.

2. The method according to claim 1 wherein the insulating layer comprises a HDP oxide layer.

3. The method according to claim 1 wherein the dielectric layer comprises an ONO layer.

4. The method according to claim 1, wherein the conductive layer comprises a tungsten silicide layer.

5. The method according to claim 1, wherein forming the word lines comprises using an anisotropic etching.

6. The method according to claim 1, wherein the tilted angle in the step of tilted ion implantation is about 20–70 degrees.

7. The method according to claim 1, wherein an oxygen is induced into the reaction chamber during the oxygen-annealing step.

* * * * *